United States Patent [19]

Matsumoto et al.

[11] Patent Number: 4,475,040

[45] Date of Patent: Oct. 2, 1984

[54] PYROELECTRIC INFRARED DETECTOR

[75] Inventors: Koichi Matsumoto; Haruo Kotani, both of Kyoto, Japan

[73] Assignee: Horiba, Ltd., Kyoto, Japan

[21] Appl. No.: 388,474

[22] Filed: Jun. 14, 1982

[30] Foreign Application Priority Data

Dec. 9, 1981 [JP] Japan ............... 56-184582[U]

[51] Int. Cl.³ .............................. G01J 5/00
[52] U.S. Cl. ............................... 250/338; 250/349
[58] Field of Search ............. 250/338, 342, 349

[56] References Cited

U.S. PATENT DOCUMENTS 3,480,777 11/1969 Astheimer ................. 250/349
3,839,640 10/1974 Rossin .
4,284,888 8/1981 Appleby ..................... 250/338

Primary Examiner—Janice A. Howell
Assistant Examiner—Constantine Hannaher
Attorney, Agent, or Firm—Wenderoth, Lind & Ponack

[57] ABSTRACT

A pyroelectric infrared detector of the dual element type has its two elements connected in parallel but with opposite polarities. The dual elements are arranged such that the detector element outputs may be taken out from only one side of the pyroelectric material used to form the detector. The detector utilizes supplementary elements which are insensitive to infrared radiation and interconnecting members to connect the supplementary elements to the detector elements so as to enable the interconnection of the dual parallel elements with opposite polarities to external circuitry by wires connected to only a single side of the pyroelectric material.

5 Claims, 5 Drawing Figures

PYROELECTRIC INFRARED DETECTOR

BACKGROUND OF THE INVENTION

1. Field of the Invention

The present invention relates to a pyroelectric infrared detector; more particularly, the present invention relates to an improved infrared detector of the dual element type where the elements are connected in parallel but with opposite polarities.

2. Description of the Prior Art

U.S. Pat. 3,839,640 to Rossin discloses an infrared detector of the dual element type where the elements are connected in series but with opposite polarities. This detector has also a structural and manufacturing advantage in that the lead wires can be taken out from an electrode, which is mounted on one side of the pyroelectric materials, by means of a single operation. In addition, the device has excellent characteristics since various noise signals due to disturbances can be eliminated because of the fact that the dual elements are connected so as to have opposite polarities.

An example of a prior art detector of the dual element type where the elements are connected in parallel but with opposite polarities is shown in FIG. 1. However, this detector has a disadvantage in that four separate lead wires 4 must be taken out from electrodes 2a, 2b, 3a, 3b mounted on both sides of a pyroelectric material 1 and is thereby difficult to manufacture. Accordingly, it is necessary to taken out lead wires from only one side of a pyroelectric material in a fashion similar to the previously noted Rossin detector which has its elements connected in series but with opposite polarities in order to improve the manufacturability of a detector having its elements connected in parallel but with opposite polarities.

One prior art method cuts the central part (C) of said pyroelectric material 1 into two parts, one of the resulting two pieces being turned over and both pieces being bonded, so as to thereby reduce the number of lead wires by respectively taking out one lead wire from both sides of said pyroelectric material 1, as shown in FIG. 1. However, such a method cannot solve the previously noted problem in that lead wires cannot be taken out by a single operation because lead wires must be taken out from both sides of the pyroelectric material. In addition, the prior art method is equivalent to a configuration where two detectors of single element type construction are bonded opposite to each other in the direction thereof and thus has the disadvantage of an inferior balance of the element characteristics. Thus, it is necessary to mount all electrodes on a single pyroelectric material in order to improve the balance of the element characteristics.

SUMMARY OF THE INVENTION

It is an object of the present invention to provide an improved dual element type pyroelectric infrared detector, which can effect the connection of the two elements in parallel but with opposite polarities by taking out two lead wires from one side of a pyroelectric material in spite of the substantial dual type construction, wherein a single pyroelectric material is provided with two pairs of electrodes which are sensitive to infrared radiation.

BRIEF DESCRIPTION OF THE DRAWINGS

FIGS. 2(A), 2(B), 3, and 4 illustrate one of the preferred embodiments of a pyroelectric infrared detector according to the present invention, wherein:

FIG. 2(A) is a plan view thereof,

FIG. 2(B) is a bottom view thereof,

FIG. 3 is a cross-section view of FIG. 2(A) taken along the line III—III thereof, and FIG. 4 is an equivalent circuit diagram thereof.

DESCRIPTION OF THE PREFERRED EMBODIMENT

One of the preferred embodiments of the present invention will be described below by reference to the attached drawings.

Figure 1:
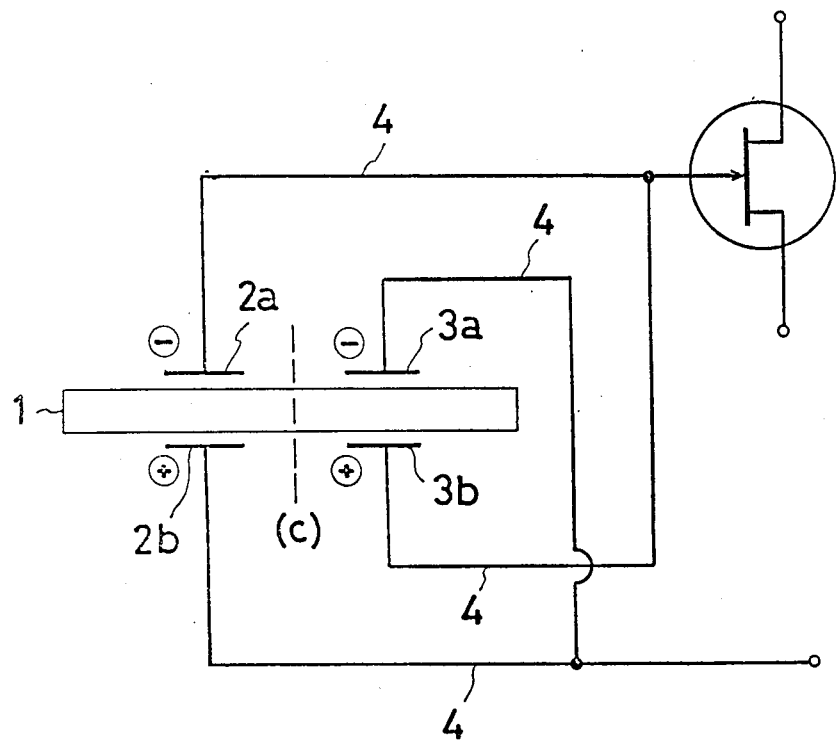
FIG. 1 illustrates a conventional pyroelectric infrared detector of dual element type construction having two elements connected in parallel but with opposite polarities.
Figure 2:
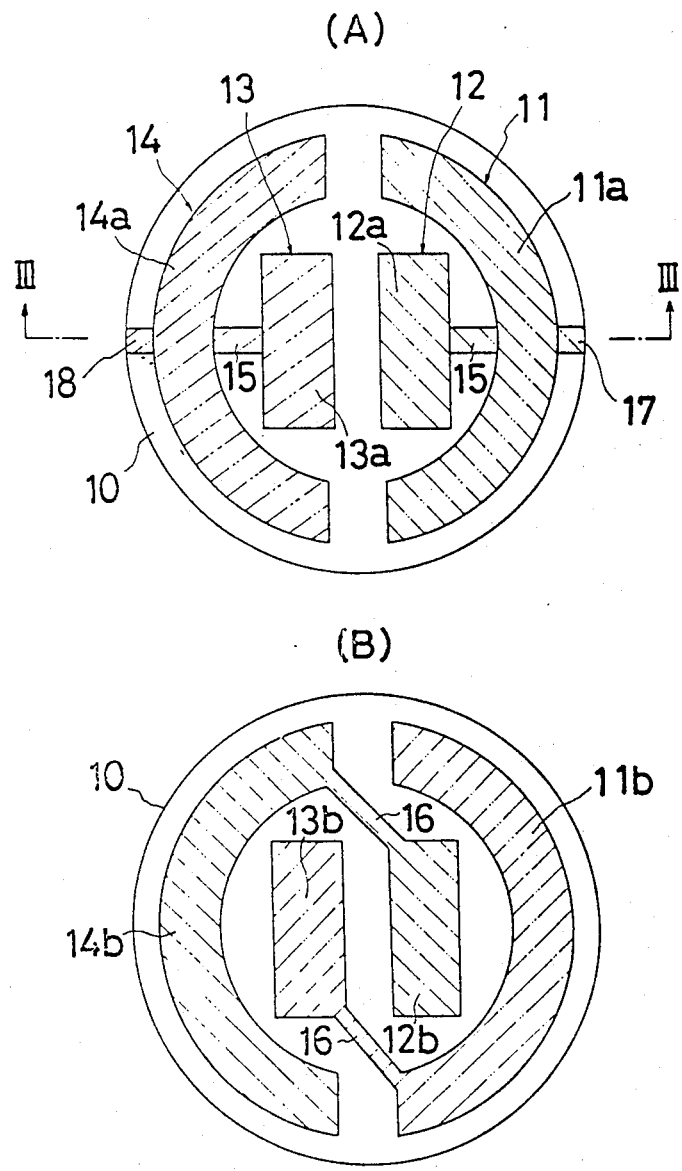
Figure 3:
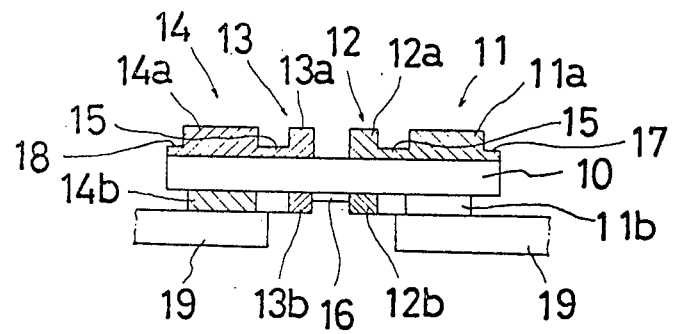

Referring now to the drawing figures, numerical designation 10 represents a single organic and inorganic material showing pyroelectric effect, (hereinafter referred to as a pyroelectric material), for example, PZT, $LiTaO_3$, $LiNbO_3$, SBN, $PbTiO_3$, $PVF_2$, TGS and the like. Numerical designations 11a, 11a, 12a, 12b, 13a, 13b, 14a, 14b represent electrodes formed on the front side and the reverse side of the pyroelectric material 10 by means of vacuum evaporation sputtering, etching and the like, the electrodes being made of, for example, Au, Ni, NiCr, Ta, Cr, Ti, Al and the like. The electrode 11a, which has the same shape as the electrode 11b formed on the reverse side of the pyroelectric material 10, but formed on the front side of the pyroelectric material 10 is arranged so as to be in correspondence with the electrode 11b and the pyroelectric material 10 is provided between the electrode 11a and the electrode 11b. The placement of the remaining electrode pairs 12a and 12b, 13a and 13b, 14a and 14b is effected in a similar fashion. In addition, as clearly illustrated in FIGS. 2(A) and 2(B), electrode 12a is in a mirror image symmetrical relationship to electrode 13a, electrode 11a is in a mirror image symmetrical relationship to electrode 14a, electrode 12b is in a mirror image symmetrical relationship to electrode 13b, and electrode 11b is in a mirror image symmetrical relationship to electrode 14b. Four elements 11, 12, 13, 14 are constructed from pairs of electrode (11a and 11b, 12a and 12b, 13a and 13b, and 14a and 14b) which are arranged on the front side and the reverse side of the pyroelectric material 10 in correspondence with each other. The elements 12 and 13, in which the front side electrodes 12a, 13a are provided with an infrared absorption material (not shown), for example, gold black, platinum black and the like and an infrared transparent material, for example, Ni, NiCr, Au, TnSb and the like evaporated thereon, serve as the active elements which are sensitive to infrared radiation. On the other hand, the remaining elements 11 and 14, in which the front side electrodes 11a, 14a are made of an infrared reflecting material, for example, Al, Au and the like, (material of a sufficient thickness to reflect infrared radiation), or having surfaces which are coated with an infrared reflecting material, serve as supplementary elements which are not sensitive to infrared radiation. One of the active elements which is sensitive to infrared radiation (hereinafter referred to as the first element) 12 is provided with electrode 12a connected to electrode 11a of one of the supplementary electrodes which is not sensitive to infrared radiation, (hereinafter referred to as the first supplementary electrode) 11. Electrodes 11a and 12a are electrically connected through one member 15 on the front side of the pyroelectric material 10. Similarly, electrode 13a of another element (hereinafter referred to as the second element) 13 is electrically connected to electrode 14a of another supplementary element (hereinafter referred to as the second supplementary element) 14 through another member 15. In addition, electrode 12b of the first element 12 is electrically connected to electrode 14b of the second supplementary element 14 through one member 16 while electrode 13b of the second element 13 is electrically connected to electrode 11b of the first supplementary element 11 through another member 16 on the reverse side of the pyroelectric material 10. The members 15 and 16 can be formed from the same material as electrodes 11a, 11b, 12a, 12b, 13a, 13b, 14a, or 14b using the same technique used in the formation of these electrodes (vacuum evaporation, sputtering or etching, for example) and simultaneously with the formation of these electrodes on the pyroelectric material 10. Numerical designations 17 and 18 represent the taking out portions of the electrodes. The taking out portions 17 and 18 can also be formed from the same material as the members 15 and 16, that is, the same material as the electrodes and using the same technique as the members 15 and 16 and simultaneously with the formation of members 15 and 16. Lead wires are connected to the taking out portions 17 and 18. The taking our portions 17 and 18 are not formed on the reverse side of the pyroelectric material 10 but are formed only on the front side of the pyroelectric material 10. Numerical designation 19 represents a material, on which the pyroelectric material 10 is mounted, for example, an alumina substrate. In general, a FET for converting a high impedance of the pyroelectric device to a low impedance and various kinds of passive elements are mounted on the upper surface or the lower surface of the substrate 19.

Figure 4:
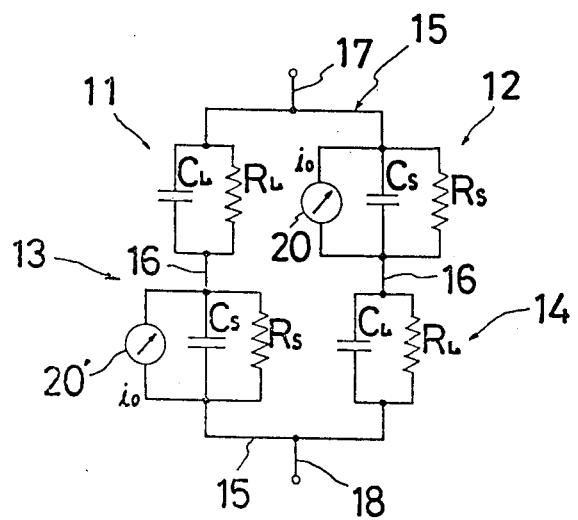

The construction and the operation of the detector in accordance with the present invention is described below with reference to an equivalent circuit as shown in FIG. 4. Referring now to FIG. 4, elements 20 and 20' are ammeters for detecting the pyroelectric current $i_0$ which is generated when the elements 12 and 13 detect infrared radiation and the like; $C_s$ is the capacitance between electrode 12a and electrode 12b as well as the capacitance between electrode 13a and electrode 13b; $R_s$ is the electrical resistance between electrode 12a and electrode 12b as well as the electrical resistance between electrode 13a and electrode 13b; $C_L$ is the capacitance between electrode 11a and electrode 11b as well as the capacitance between electrode 14a and electrode 14b; and $R_L$ is the electrical resistance between electrode 11a and electrode 11b as well as the electrical resistance between electrode 14a and electrode 14b.

It can be said that the detector in accordance with the present invention is substantially a detector of dual construction with respect to the infrared detection function because two of the four elements 11-14 are supplementary elements which are not sensitive to infrared radiation. In addition, although the elements 12 and 13 which are sensitive to infrared radiation are connected through the supplementary elements 11 and 14, the supplementary elements 11 and 14 are not sensitive to infrared radiation and as a result the supplementary elements 11 and 14 can be disregarded, and accordingly, with respect to the infrared detection function, elements 12 and 13 are effectively connected in parallel but with opposite polarities to the taking out portions 17 and 18.

Accordingly, such a detector has a structural and operational advantage in that is is only necessary to take out two lead wires from the surface of the single pyroelectric material 10 in spite of the fact that the detector is of the dual element construction configuration having two elements connected in parallel but with opposite polarities.

Sunlight, light from illuminators and the like (optical disturbances of the same phase) incident upon the elements can be compensated for because of the dual element construction configuration described above.

The influence of vibration and the like (mechanical disturbances of the same phase) transmitted through lead wires and the like can also be compensated for because of the dual element construction configuration.

Heat transmitted through the lead wires or the material 19, on which the pyroelectric material is mounted, is diffused through the supplementary elements 11 and 14 and a homogeneous temperature distribution can thereby be quickly attained in the pyroelectric material 10 because the lead wires are connected to the supplementary elements 11 and 14 through the taking out portions 17 and 18 and the material 19, on which the pyroelectric material is mounted, is in contact with the electrodes 11b and 14b of the supplementary elements 11 and 14. In general, the action of a pyroelectric material is unstable if its temperature distribution is unhomogeneous. The action of a pyroelectric material is stable if its temperature distribution is homogeneous as described above. Consequently, a pyroelectric infrared detector of the above-described construction is heat resistant.

The above-described detector has an electric resistance which is higher than that of other detectors of the dual element construction configuration due to the electrical resistance $R_L$ of the supplementary elements. It is known that the S/N ratio of a detector is generally inversely proportional to its electrical resistance. It is, however, possible to improve the S/N ratio of the above-described detector to the extent that it is substantially equal to the S/N ratio of other detectors of the dual element construction configuration by sufficiently increasing the surface area of the electrodes of the supplementary elements 11 and 14 in comparison to the surface area of the electrodes of the elements 12 and 13 as shown in the drawing figures.

It can be concluded from the reasons described above that a detector of the above-described construction is superior to other detectors of the dual element construction configuration because the detector of the above-described construction is equal to other detectors of the dual element construction configuration with respect to its operation and superior to the latter with respect to its heat stability.

Although the taking out portions of the lead wires are formed only on the front side of the pyroelectric material 10 in the above-described preferred embodiment, it goes without saying that they may be formed only on the reverse side of the pyroelectric material 10.

As described above, a pyroelectric infrared detector of the present invention is provided with four pairs of electrodes arranged on the front side and the reverse side of a single pyroelectric material and in correspondence with each other to form two pairs of active elements which are sensitive to infrared radiation and two pairs of supplementary elements which are not sensitive to infrared radiation. The electrode of the first element which is formed on one of the sides of the single pyroelectric material is electrocally connected to the electrode of the first supplementary element formed on one of the sides of the single pyroelectric material, and the electrode of the second element which is formed on one of the sides of the single pyroelectric material is electrically connected to the electrode of the second element which is formed on one of the sides of the single pyroelectric material. The electrode of the first element which is formed on a second of the sides of the pyroelectric material is electrically connected to the electrode of the second supplementary element which is formed on the second side of the single pyroelectric material, and the electrode of the second element which is formed on the second side of the single pyroelectric material is electrically connected to the electrode of the first supplementary element which is formed on the second side of the single pyroelectric material. Accordingly, it is necessary to only take out two lead wires from only one side of the pyroelectric material, for example, taking out lead wires from the electrode of the first supplementary element which is formed on one side of the single pyroelectric material and the electrode of the second supplementary element which is formed on one side of the single pyroelectric material, in order to construct a detector, which is substantially of dual element construction, and having elements which are connected in parallel but with opposite polarities. Thus, lead wires can be easily taken out by means of a single operation. In particular, a detector of the construction described in the above-described preferred embodiment of the present invention has a constructional as well as operational advantage superior to other detectors of dual element type construction.

We claim:

1. A pyroelectric infrared detector provided with four pairs of electrodes arranged on a front side and a reverse side of a single pyroelectric material plate, one electrode of each of said four pair of electrodes being arranged on said front side of said plate and the other electrode of each of said four pair of electrodes being arranged on said reverse side of said plate, each electrode of each pair of electrodes being in correspondence with each other to form first and second elements which are sensitive to infrared radiation and first and second supplementary elements which are insensitive to infrared radiation; wherein a first electrode of said first element which is formed on one of said sides of said single pyroelectric material is electrically connected to a first electrode of said first supplementary element which is formed on said one side of said single pyroelectric material, and a first electrode of said second element which is formed on said one side of said single pyroelectric material is electrically connected to a first electrode of said second supplementary element which is formed on said one side of said single pyroelectric material; and wherein a second electrode of said first element which is formed on another of said sides of said single pyroelectric material is electrically connected to a second electrode of said second supplementary element which is formed on said another side of said single pyroelectric material, and a second electrode of said second element which is formed on said another side of said single pyroelectric material is electrically connected to a second electrode of said first supplementary element which is formed on said another side of said single pyroelectric material.

2. A pyroelectric infrared detector as recited in claim 1, further comprising two electrode taking out portions operatively connected to said elements and are formed on only one side of said front and reverse sides of said pyroelectric material.

3. A pyroelectric infrared detector as recited in claim 1, wherein said pairs of electrodes which are arranged on said front and reverse sides of said single pyroelectric material in correspondence with each other, have the same shape.

4. A pyroelectric infrared detector as recited in claim 1, wherein said first electrode of said first element is arranged to be a symmetrical mirror image of said first electrode of said second element, and said first electrode of said first supplementary element is arranged to be a symmetrical mirror image of said first electrode of said second supplementary element, and wherein said second electrode of said first element is arranged to be a symmetrical mirror image of said second electrode of said second element, and said second electrode of said first supplementary element is arranged to be a symmetrical mirror image of said second electrode of said second supplementary element.

5. A pyroelectric infrared detector as recited in claim 1, further comprising members for electrically connecting said electrodes, wherein said members and said electrode taking out portions are simultaneously formed on said pyroelectric material from the same material as that forming said electrodes and by the same technique as that used to form said electrodes.

* * * * *